United States Patent
Gluschenkov et al.

(10) Patent No.: US 9,773,901 B1
(45) Date of Patent: Sep. 26, 2017

(54) BOTTOM SPACER FORMATION FOR VERTICAL TRANSISTOR

(71) Applicant: International Business Machines Corporation, Armonk, NY (US)

(72) Inventors: Oleg Gluschenkov, Tannersville, NY (US); Sanjay C. Mehta, Niskayuna, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/335,105

(22) Filed: Oct. 26, 2016

(51) Int. Cl.
*H01L 29/06* (2006.01)
*H01L 29/78* (2006.01)
*H01L 29/66* (2006.01)

(52) U.S. Cl.
CPC ...... *H01L 29/7827* (2013.01); *H01L 29/0653* (2013.01); *H01L 29/6656* (2013.01); *H01L 29/66666* (2013.01)

(58) Field of Classification Search
None
See application file for complete search history.

(56) References Cited

U.S. PATENT DOCUMENTS

| | | | |
|---|---|---|---|
| 5,087,581 A | 2/1992 | Rodder | |
| 5,935,873 A | 8/1999 | Spuler et al. | |
| 7,683,428 B2 | 3/2010 | Chidambarrao et al. | |
| 8,809,194 B2 * | 8/2014 | Ranjan | H01L 21/0206 216/46 |
| 9,190,466 B2 | 11/2015 | Basker et al. | |
| 9,299,835 B1 | 3/2016 | Anderson et al. | |
| 2003/0013241 A1 | 1/2003 | Rockwell et al. | |
| 2004/0121526 A1 * | 6/2004 | Yamamoto | H01L 21/823468 438/142 |

(Continued)

OTHER PUBLICATIONS

E Memišević et al., "Thin electron beam defined hydrogen silsesquioxane spacers for vertical nanowire transistors," Journal of Vacuum Science & Technology B, published Sep. 11, 2014, pp. 051211-1 to 051211-6, vol. 32, No. 5.

(Continued)

*Primary Examiner* — Alexander Ghyka
(74) *Attorney, Agent, or Firm* — Scully, Scott, Murphy & Presser, P.C.; Daniel P. Morris, Esq.

(57) ABSTRACT

A bilayer of silicon dioxide and silicon nitride is formed on exposed surfaces of at least one semiconductor fin having a bottom source/drain region located at the footprint, and on each side, of the at least one semiconductor fin. An upper surface of each horizontal portion of the silicon nitride layer is then carbonized, and thereafter non-carbonized vertical portions of the silicon nitride layer are removed. Next, the carbonized portions of the silicon nitride layer are removed, and thereafter the vertical portions of the silicon dioxide layer are removed from sidewalls of the at least one semiconductor fin utilizing each remaining portion of the silicon nitride layer as an etch mask A bottom spacer structure is provided on each bottom source/drain region in which each bottom spacer structure includes a remaining portion of the silicon dioxide layer and the remaining portion of the silicon nitride layer.

10 Claims, 5 Drawing Sheets

(56) References Cited

U.S. PATENT DOCUMENTS

2015/0140751 A1*  5/2015  Yu ................... H01L 21/823857
                                                          438/230
2016/0197160 A1*  7/2016  Posseme ................ H01L 21/84
                                                          438/696
2017/0053834 A1*  2/2017  Basker ................ H01L 27/1211

OTHER PUBLICATIONS

V. D. Kunz et al., "Reduction of parasitic capacitance in vertical MOSFETs by spacer local oxidation," IEEE Trans. on Electron Devices, Jun. 2003, pp. 1487-1493, vol. 50, No. 6.

K. Cheng et al., "Fabrication of Vertical Field Effect Transistor Structure With Controlled Gate Length," U.S. Appl. No. 15/087,074, filed Mar. 31, 2016, 50 pages.

H. V. Mallela et al., "Vertical Field Effect Transistors With Metallic Source/Drain Regions," U.S. Appl. No. 15/140,763, filed Apr. 28, 2016, 68 pages.

* cited by examiner

BOTTOM SPACER FORMATION FOR VERTICAL TRANSISTOR

BACKGROUND

The present application relates to a semiconductor structure and a method of forming the same. More particularly, the present application relates to a semiconductor structure including a vertical transistor having a bottom spacer structure that is present on a bottom source/drain region, wherein the bottom spacer structure includes a silicon dioxide spacer and a silicon nitride spacer. The present application also provides a method of forming such a semiconductor structure.

Conventional vertical transistors are devices where the source-drain current flows in a direction normal, i.e., vertical, to the substrate surface. In such devices, a vertical semiconductor pillar defines the channel with the source and drain located at opposing ends of the semiconductor pillar. One advantage of a vertical transistor is that the channel length is not defined by lithography, but by methods such as epitaxy or layer deposition, which enable precise dimensional control. As such, vertical transistors are an attractive option for technology scaling for 5 nm and beyond.

In conventional vertical transistor device architecture, it is difficult to remove the bottom spacer material from the sidewalls of the vertical semiconductor pillar without removing portions of the bottom spacer material that are present above the bottom source/drain region that is formed at the footprint of the vertical semiconductor pillar. Instead, conventional vertical transistors typically have a step coverage of the bottom spacer material along the sidewalls of the vertical semiconductor pillar. Such step coverage may lead to variation in channel length and junction location. As such, there is a need for providing a semiconductor structure including a vertical transistor in which the step coverage of the bottom spacer is minimized thus reducing the variation in channel length and junction location of the vertical transistor.

SUMMARY

A bilayer of silicon dioxide and silicon nitride is formed on exposed surfaces of at least one semiconductor fin having a bottom source/drain region located at the footprint, and on each side, of the at least one semiconductor fin. An upper surface of each horizontal portion of the silicon nitride layer is then carbonized, and thereafter non-carbonized vertical portions of the silicon nitride layer are removed. Next, the carbonized portions of the silicon nitride layer are removed, and thereafter the vertical portions of the silicon dioxide layer are removed from sidewalls of the at least one semiconductor fin utilizing each remaining portion of the silicon nitride layer as an etch mask. A bottom spacer structure is provided on each bottom source/drain region in which each bottom spacer structure includes a remaining portion of the silicon dioxide layer and the remaining portion of the silicon nitride layer. In the present application, step coverage of the bottom spacer is minimized thus reducing the variation in channel length and junction location of the vertical transistor.

In one aspect of the present application, a semiconductor structure is provided. In one embodiment of the present application, the semiconductor structure includes at least one semiconductor fin extending upward from a surface of a substrate. A bottom source/drain region is located at the footprint, and on each side, of the at least one semiconductor fin. A bottom spacer structure is located on each bottom source/drain region. Each bottom spacer structure comprises a silicon dioxide spacer and a silicon nitride spacer, wherein the silicon nitride spacer is entirely separated from the at least one semiconductor fin by a first portion of the silicon dioxide spacer and entirely separated from the bottom source/drain region by a second portion of the silicon dioxide spacer. The structure of the present application further includes a functional gate structure located on each side of the at least one semiconductor fin and above the bottom spacer structure, a top spacer located on each functional gate structure and contacting a sidewall of a portion of the at least one semiconductor fin, and a top source/drain structure extending from each sidewall of an upper portion of the at least one semiconductor fin.

In another aspect of the present application, a method of forming a semiconductor structure is provided. In one embodiment of the present application, the method includes forming at least one semiconductor fin extending upward from a surface of a substrate, wherein a bottom source/drain region is located at the footprint, and on each side, of the at least one semiconductor fin. Next, a dielectric material stack of, from bottom to top, a silicon dioxide layer and a silicon nitride layer is formed on exposed surfaces of each bottom source/drain region and the at least one semiconductor fin. An upper surface of each horizontal portion of the silicon nitride layer is then carbonized, and thereafter non-carbonized vertical portions of the silicon nitride layer are removed. Next, the carbonized portions of the silicon nitride layer are removed, and thereafter the vertical portions of the silicon dioxide layer are removed from sidewalls of the at least one utilizing each remaining portion of the silicon nitride layer as an etch mask to provide a bottom spacer structure located on each bottom source/drain region, each bottom spacer structure comprises a remaining portion of the silicon dioxide layer and the remaining portion of the silicon nitride layer.

The method may further include: forming a functional gate structure located on each side of the at least one semiconductor fin and above the bottom spacer structure, forming a top spacer located on each functional gate structure and contacting a sidewall of a portion of the at least one semiconductor fin, and forming a top source/drain structure extending from each sidewall of an upper portion of the at least one semiconductor fin.

DETAILED DESCRIPTION

Figure 1:
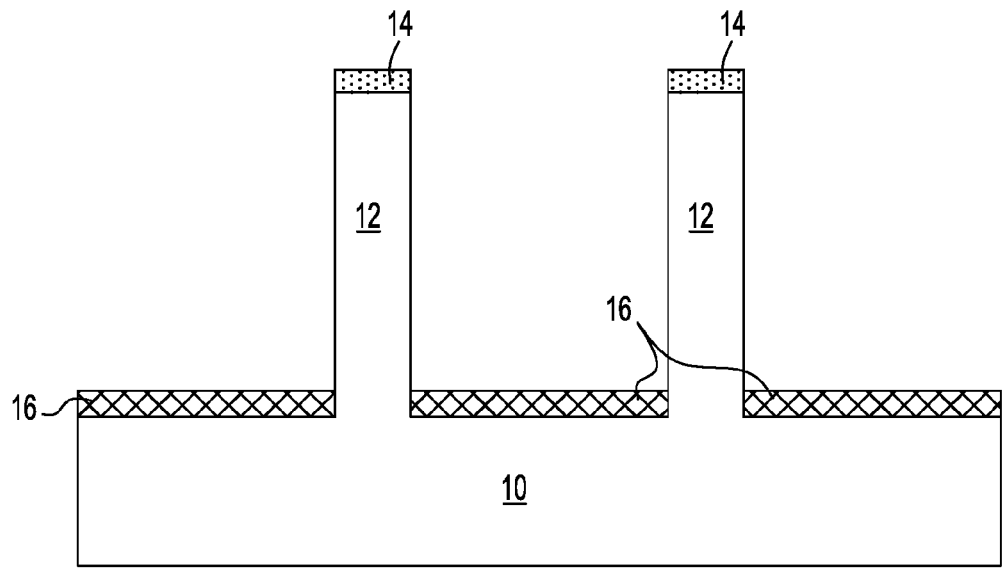
FIG. 1 is a cross sectional view of an exemplary semiconductor structure including a plurality of semiconductor fins located on a surface of a substrate, wherein a bottom source/drain region is present at the footprint, and on each side of, the semiconductor fins.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in one embodiment of the present application. The exemplary semiconductor structure of FIG. 1 includes a plurality of semiconductor fins 12 (two of which are shown by way of one example) located on a surface of a substrate 10, wherein a bottom source/drain region 16 is present at the footprint, and on each side, of the semiconductor fins 12. Each semiconductor fin 12 may be capped with a hard mask cap 14. Although the present application describes and illustrates the formation of a plurality of semiconductor fins 12 extending upwards from substrate 10, the present application can be employed when only a single semiconductor fin is formed. The semiconductor fins 12 may also be referred to a vertical semiconductor pillar.

The exemplary semiconductor structure that is shown in FIG. 1 can be formed by first providing a bulk semiconductor substrate (not shown). The term "bulk" when used in conjunction with the term "semiconductor substrate" denotes a substrate that is entirely composed of one or more semiconductor materials having semiconducting properties; no insulator materials or conductive materials are present in a bulk semiconductor substrate.

Examples of semiconductor materials that may provide at least a portion of the bulk semiconductor substrate include silicon (Si), germanium (Ge), silicon germanium alloys (SiGe), silicon carbide (SiC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the bulk semiconductor substrate may be entirely composed of silicon. In another example, the bulk semiconductor substrate may include a multilayered semiconductor material stack of, and in any order, Si and a silicon germanium alloy.

The semiconductor material that provides the bulk semiconductor substrate may be a single crystalline semiconductor material. The semiconductor material that provides the bulk semiconductor substrate may have any of the well known crystal orientations. For example, the crystal orientation of the bulk semiconductor substrate may be {100}, {110}, or {111}. Other crystallographic orientations besides those specifically mentioned can also be used in the present application.

After providing the bulk semiconductor substrate, a layer of hard mask material (not shown) is formed upon the topmost surface of the bulk semiconductor substrate. The layer of hard mask material is a continuous layer that is formed on the entirety of the bulk semiconductor substrate. The layer of hard mask material may be composed of a dielectric oxide, a dielectric nitride, a dielectric oxynitride or a multilayered combination thereof. The uppermost portion of the layer of hard mask material is composed of a different dielectric material than the bottom layer of the dielectric material stack (18, 20) to be subsequently formed on the exemplary semiconductor structure shown in FIG. 1. In one example, the layer of hard mask material may be composed of silicon nitride and/or silicon oxynitride. In one embodiment, the layer of hard mask material may be formed by a deposition process such as, for example, chemical vapor deposition (CVD) or plasma enhanced chemical vapor deposition. In another embodiment, the layer of hard mask material may be formed by a thermal growth process such as, for example, thermal oxidation and/or thermal nitridation. In yet another embodiment, the layer of hard mask material may be formed utilizing a combination of a deposition process and thermal growth. The layer of hard mask material that is formed on the bulk semiconductor substrate may have a thickness from 5 nm to 20 nm; although other thicknesses that are lesser than, or greater than, the aforementioned thickness range can also be used as the thickness of the layer of hard mask material.

After providing the bulk semiconductor substrate and the layer of the hard mask material, the layer of hard mask material and the bulk semiconductor substrate are patterned to provide a plurality of fin structures that include a semiconductor fin 12 and a hard mask cap 14 extending upward from substrate 10. Each hard mask cap 14 constitutes a remaining portion of the layer of hard mask material, each semiconductor fin 12 constitutes a remaining upper portion of the bulk semiconductor substrate, and substrate 10 constitutes a remaining portion of the bulk semiconductor substrate. In some embodiments (and as illustrated in the drawings of the present application), no material interface exists between the semiconductor fins 12 and the substrate 10. In other embodiments (not specifically illustrated), a material interface exists between the semiconductor fins 12 and the substrate 10.

In one embodiment, patterning may include lithography and etching. The lithographic process includes forming a photoresist (not shown) atop a material or material stack to be patterned, exposing the photoresist to a desired pattern of radiation and developing the exposed photoresist utilizing a conventional resist developer. The photoresist may be a positive-tone photoresist, a negative-tone photoresist or a hybrid-tone photoresist. The photoresist may be formed utilizing a deposition process such as, for example, spin-on coating. The etching process includes a dry etching process (such as, for example, reactive ion etching, ion beam etching, plasma etching or laser ablation), and/or a wet chemical etching process. Typically, reactive ion etching is used in providing the fin structures (12, 14) shown in FIG. 1 of the present application. In some embodiments, the etching process includes a first pattern transfer step in which the pattern provided to the photoresist is transferred to the layer of hard mask material, the patterned photoresist is then removed by an ashing step, and thereafter, a second pattern transfer step is used to transfer the pattern from the patterned layer of hard mask material (i.e., hard mask caps 14) into the underlying bulk semiconductor substrate.

In another embodiment, patterning may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin 12 has a height from 20 nm to 200 nm, and a width from 5 nm to 30 nm. Other heights and/or widths that are lesser than, or greater than, the ranges mentioned herein can also be used in the present application. Each semiconductor fin 12 is spaced apart from its nearest neighboring semiconductor fin 12 by a pitch of from 20 nm to 100 nm. Also, each semiconductor fin 12 is oriented parallel to each other.

At this point of the present application, bottom source/drain regions 16 can be formed at the footprint, and on each side, of the semiconductor fins 12. Each bottom source/drain region 16 includes a semiconductor material and a p-type or n-type dopant; stated in other terms, each bottom source/drain region 16 is composed of a doped semiconductor material. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The semiconductor material that provides each bottom source/drain region 16 may include one of the semiconductor materials mentioned above for the bulk semiconductor substrate. In one embodiment, each bottom source/drain region 16 is composed of a same semiconductor material as substrate 10. In another embodiment, each bottom source/drain region 16 can be composed of a different semiconductor material than substrate 10. Each bottom source/drain region 16 may have a dopant concentration that can be within a range from $2\times10^{20}$ atoms/cm$^3$ to $1\times10^{21}$ atoms/cm$^3$.

In one embodiment, the bottom source/drain regions 16 can be formed by introducing a p-type or n-type dopant into the substrate 10. In one example, ion implantation be used to introduce the dopant into the substrate 10, followed by an anneal. In such an embodiment, the semiconductor material that provides each bottom source/drain region 16 is the same as the substrate 10.

In another embodiment, the bottom source/drain regions 16 can be formed by epitaxially growing a doped semiconductor material on the substrate 10 or within a trench formed into the substrate 10. In this embodiment, the semiconductor material that provides the source/drain regions 16 may be the same as, or different from, the semiconductor material that provides substrate 10.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. Thus, each bottom source/drain regions 16 has as an epitaxial relationship with the growth surface of substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 500° C. to 900° C. Although higher temperature typically results in faster deposition, the faster deposition may result in crystal defects and film cracking. The epitaxial growth can be performed utilizing any well known precursor gas or gas mixture including for example, a silicon containing precursor gas (such as silane) and/or a germanium containing precursor gas (such as a germane). Carrier gases like hydrogen, nitrogen, helium and argon can be used. A dopant can be introduced into the precursor gas during the epitaxial growth process. In other embodiments, the dopant can be introduced after the epitaxial growth process.

Figure 2:
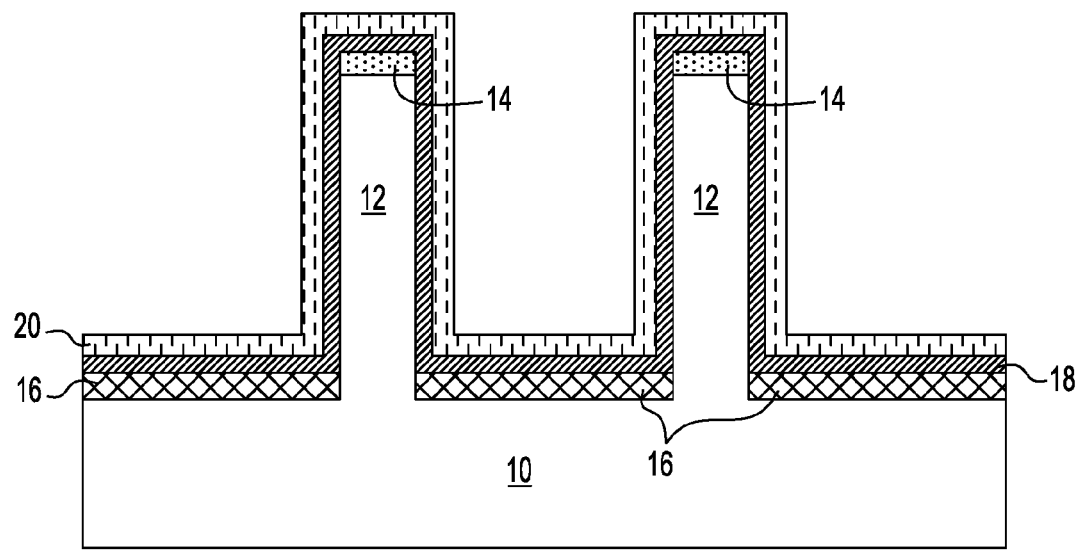
FIG. 2 is a cross sectional view of the exemplary semiconductor structure of FIG. 1 after forming a dielectric material stack of, from bottom to top, a silicon dioxide layer and a silicon nitride layer.

Referring now to FIG. 2, there is illustrated the exemplary semiconductor structure of FIG. 1 after forming a dielectric material stack (18, 20) of, from bottom to top, a silicon dioxide layer 18 and a silicon nitride layer 20. The silicon dioxide layer 18 and the silicon nitride layer 20 are both conformal layers. By "conformal" it is meant that a material has a vertical thickness (as measured from a bottom surface to a top surface) along a horizontal surface of another material that is equal to a lateral thickness (as measured from one sidewall to another sidewall) along sidewall surfaces of another material. As is shown, the dielectric material stack (18, 20) is continuously present on the exemplary semiconductor structure shown in FIG. 1. Notably, the dielectric material stack (18, 20) is present on horizontal surfaces of the substrate 10 and hard mask cap 14, and along the sidewalls of the semiconductor fins 12 and hard mask caps 14.

The silicon dioxide layer 18 can be formed utilizing a deposition process such as, for example, chemical vapor deposition, plasma enhanced chemical vapor deposition or atomic layer deposition. The thickness of the silicon dioxide layer 18 can be from 5 nm to 20 nm; although other thicknesses that are lesser than, or greater than, the aforementioned thickness range may also be used as the thickness of the silicon dioxide layer 18.

The silicon nitride layer 20 can be formed utilizing a deposition process such as, for example, chemical vapor deposition, plasma enhanced chemical vapor deposition or atomic layer deposition. The thickness of the silicon nitride layer 20 can be from 5 nm to 20 nm; although other thicknesses that are lesser than, or greater than, the aforementioned thickness range may also be used as the thickness of the silicon nitride layer 20.

As is shown, the silicon oxide layer 18 and the silicon nitride layer 20 include horizontal portions and vertical portions. The horizontal portions are present directly above the horizontal surfaces of the source/drain regions 16 and the hard mask cap 14, while the vertical portions are present along the sidewalls of the each semiconductor fin 12 and each hard mask cap 14.

Figure 3:
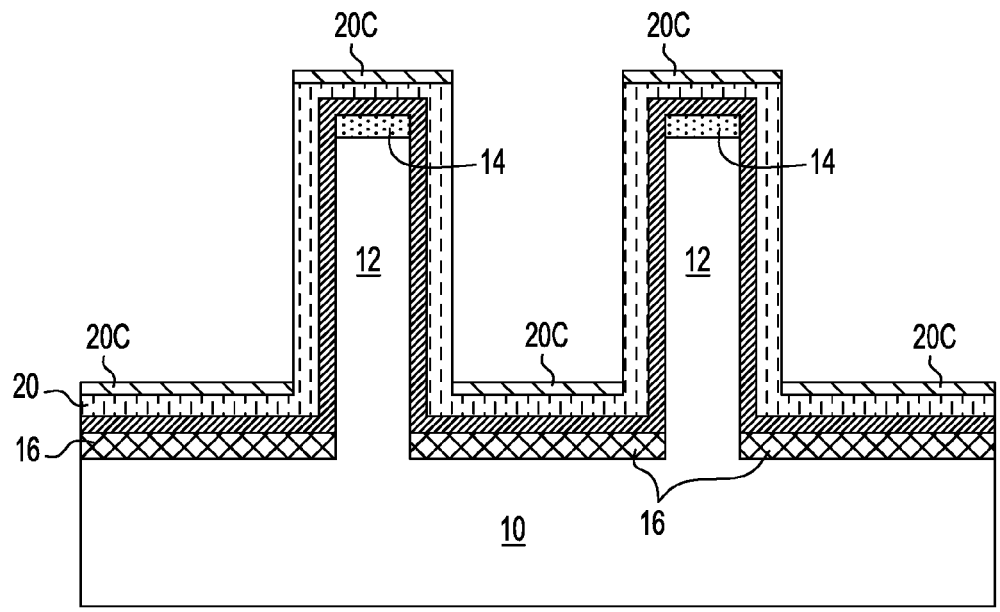
FIG. 3 is a cross sectional view of the exemplary semiconductor structure of FIG. 2 after carbonizing an upper surface of the horizontal portions of the silicon nitride layer.

Referring now to FIG. 3, there is illustrated the exemplary semiconductor structure of FIG. 2 after carbonizing an upper surface of the horizontal portions of the silicon nitride layer 20. In the drawings, element 20C represents the carbonized portions of the silicon nitride layer 20; the non-carbonized portions of the silicon nitride layer remain labeled as element 20 in the drawings of the present application The carbonized portions 20C of the silicon nitride layer 20 may also be referred to as a C enriched dielectric surface layer. The term "C enriched dielectric surface layer" denotes that the surfaces of the silicon nitride layer 20 that are exposed to carbonization have a higher carbon content therein as compared to the originally deposited silicon nitride layer 20. The carbonizing step may also be referred to as a carbon surface treatment (or plasma implantation) process.

Carbonization (i.e., carbon surface treatment process or plasma implantation) is performed utilizing a directional plasma carbon deposition process in which the energy of the deposition is 100 eV (electron volts) or less. The carbonization is performed by generating a plasma from a carbon-containing ambient such as, for example, methane. In one embodiment, the carbonization employed in the present application is performed at a temperature from 50° C. to 450° C. The carbonization can be performed by applying a bias (from 50 V to 330) to the exemplary semiconductor structure of FIG. 2.

The depth of carbonization of the horizontal portions of the silicon nitride layer 20 may vary. Typically, the depth of carbonization of the horizontal portions of the silicon nitride layer 20, as measured from the exposed surface of the silicon nitride layer 20 inward, is from 0.5 nm to 5 nm.

Each carbonized portion 20C of the silicon nitride layer 20 is composed of silicon nitride with added carbon. In some embodiments, the carbon content of each carbonized portion 20C of the silicon nitride layer 20 is 5 atomic percent or greater. In one embodiment, the carbon content of each carbonized portion 20C of the silicon nitride layer 20 can be from 10 atomic percent nitrogen to 50 atomic percent carbon. Carbon contents of less than 5 atomic percent are also contemplated.

Figure 4:
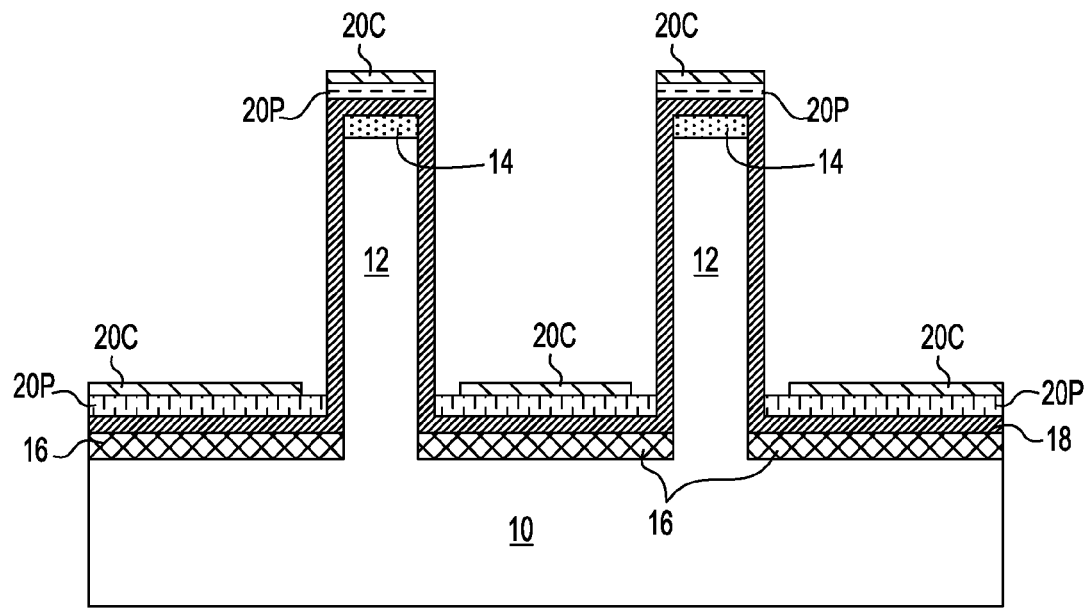
FIG. 4 is a cross sectional view of the exemplary semiconductor structure of FIG. 3 after removing the non-carbonized vertical portions of the silicon nitride layer.

Referring now to FIG. 4, there is illustrated the exemplary semiconductor structure of FIG. 3 after removing the non-carbonized vertical portions of the silicon nitride layer 20; the carbonized portions 20C of the silicon nitride layer 20 serve as an etch mask during this step of the present application. The removal of the non-carbonized vertical portions of the silicon nitride layer 20 occurs adjacent to each semiconductor fin 12 and exposes a surface of the silicon dioxide layer 18 that is present along the sidewalls of each semiconductor fin 12. After removing the non-carbonized vertical portions of the silicon nitride layer 20, a portion of the original silicon nitride layer 20 remains beneath each carbonized portion 20C. Each remaining portion of the original silicon nitride layer that remains beneath a carbonized portion 20C may be referred to herein a silicon nitride spacer 20P.

The non-carbonized vertical portions of the silicon nitride layer 20 can be removed utilizing an etching process that is selective in removing the non-carbonized vertical portions of the silicon nitride layer 20 selective to the carbonized portions 20C of the silicon nitride layer 20. In one example, the non-carbonized vertical portions of the silicon nitride layer 20 can be removed utilizing phosphoric acid.

Figure 5:
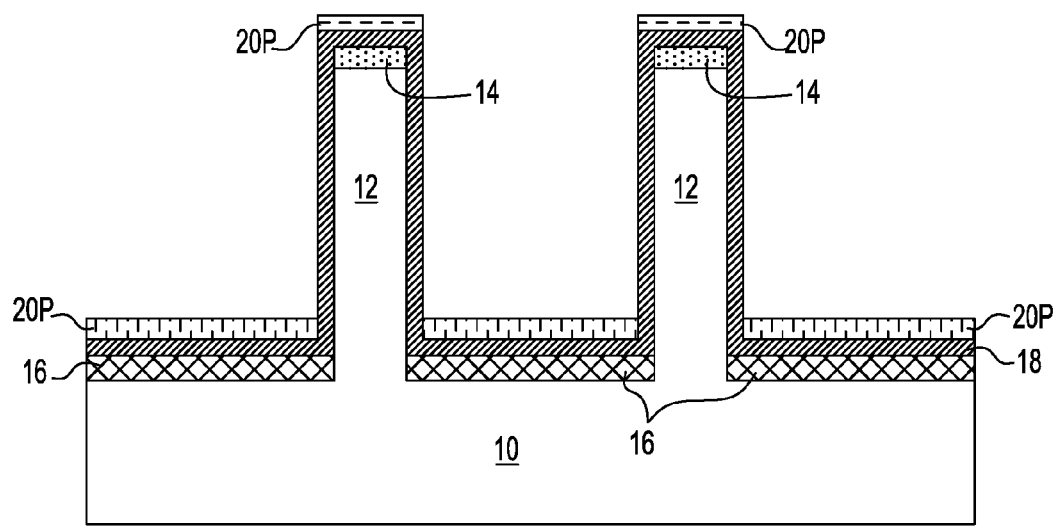
FIG. 5 is a cross sectional view of the exemplary semiconductor structure of FIG. 4 after removing the carbonized portions of the silicon nitride layer.

Referring now to FIG. 5, there is illustrated the exemplary semiconductor structure of FIG. 4 after removing the carbonized portions 20C of the silicon nitride layer 20. The removal of the carbonized portions 20C of the silicon nitride layer 20 exposes the underlying silicon nitride spacer 20P.

The carbonized portions 20C of the silicon nitride layer 20 can be removed utilizing an etching process that is selective in removing the carbonized portions 20C selective to each silicon nitride spacer 20P. In one example, the carbonized portions 20C of the silicon nitride layer 20 can be removed utilizing oxygen ashing.

Figure 6:
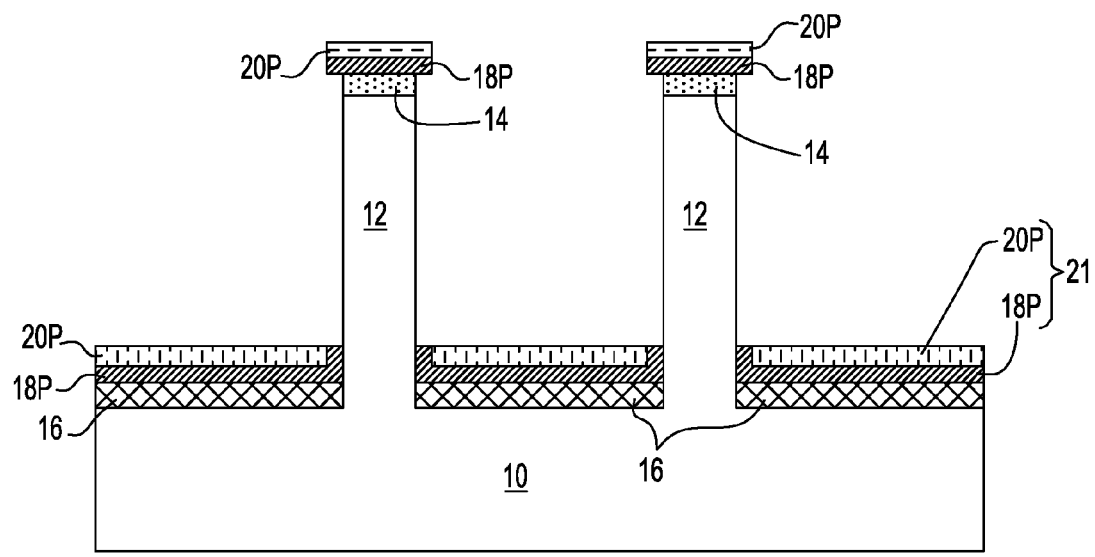
FIG. 6 is a cross sectional view of the exemplary semiconductor structure of FIG. 5 after removing vertical portions of the silicon dioxide layer from sidewalls of each semiconductor fin utilizing the remaining portions of the silicon nitride layer as an etch mask.

Referring now to FIG. 6, there is illustrated the exemplary semiconductor structure of FIG. 5 after removing vertical portions of the silicon dioxide layer 18 from sidewalls of each semiconductor fin 12 utilizing the remaining portions of the silicon nitride layer (i.e., silicon nitride spacer 20P) as an etch mask. The removal of the vertical portions of the silicon dioxide layer 18 may be performed utilizing a dry isotopic etch. The dry isotropic etch may include $CF_4$, $SF_6$ or $NF_3$ as an etchant.

After removal of the vertical portions of the silicon dioxide layer 18 from the sidewalls of each semiconductor fin 12, portions of the silicon dioxide layer 18 remain beneath each silicon nitride spacer 20P. Each remaining portion of the silicon dioxide layer 18 can be referred to herein as silicon dioxide spacer 18P. At this point of the present application and as is shown in FIG. 6, a silicon dioxide spacer 18P and a silicon nitride spacer 20P remain atop each source/drain region 16, while another silicon dioxide spacer 18P and another silicon nitride spacer 20P remain atop each hard mask cap 14. The another silicon dioxide spacer 18P and the another silicon nitride spacer 20P that remain atop each hard mask cap 14 are removed in a subsequent processing step of the present application.

The silicon dioxide spacer 18P and the silicon nitride spacer 20P that remain atop each source/drain region 16 can be referred to here as a bottom spacer structure 21.

As is shown in FIG. 6, the silicon nitride spacer 20P of each bottom spacer structure 21 is entirely separated from a bottom sidewall portion of each semiconductor fin 12 by a first portion of the silicon dioxide spacer 18P as well as being entirely separated from a topmost surface of the bottom source/drain regions 16 by a second portion of the silicon dioxide spacer 18P; each silicon dioxide spacer 18P has a bottommost surface that is located directly on a topmost surface of one of the source/drain regions 16. As is further shown, the silicon dioxide spacer 18P of each bottom spacer structure 21 has a topmost surface that is coplanar with a topmost surface of the silicon nitride spacer 20P. As is even further shown, a bottommost surface of each silicon nitride spacer 20P of the bottom spacer structure 21 is present on a surface of one of the underlying silicon oxide spacer portions 18P of the bottom spacer structure 21. In the present application, the bottom spacer structure 21 is present beneath the topmost surface of each semiconductor fin 12 and a portion of the bottom spacer structure 21, i.e., the first portion of the silicon oxide spacer 18P mentioned above, directly contacts a lower sidewall of each semiconductor fin 12.

Figure 7:
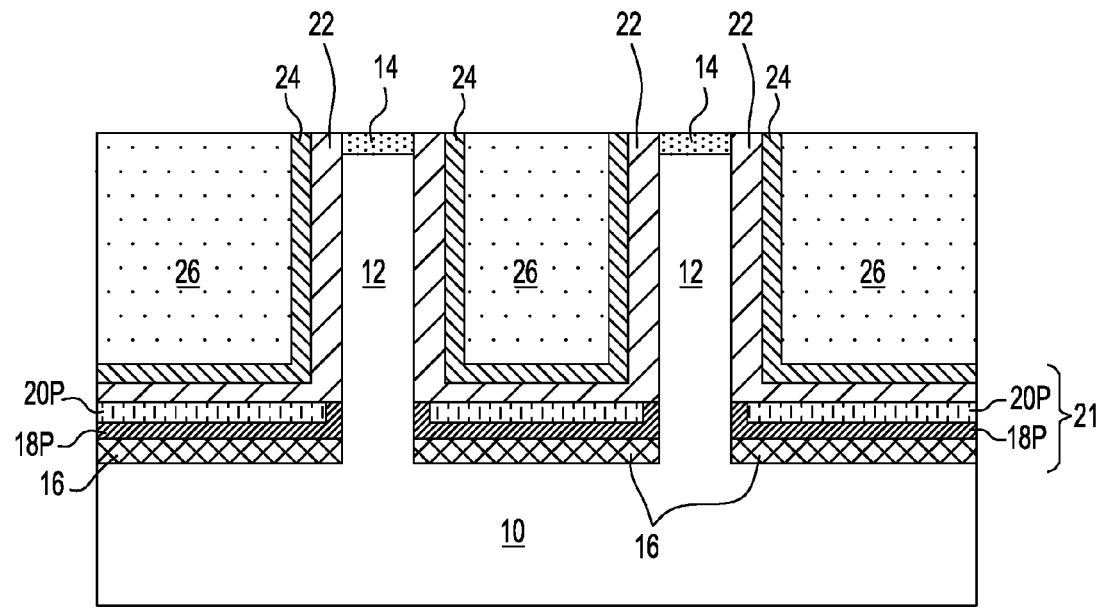
FIG. 7 is a cross sectional view of the exemplary semiconductor structure of FIG. 6 after forming a functional gate structure on each side of the semiconductor fins.

Referring now to FIG. 7, there is illustrated the exemplary semiconductor structure of FIG. 6 after forming a functional gate structure (22, 24, 26) on each side of the semiconductor fins 12. Each functional gate structure (22, 24, 26) is formed above the bottom spacer structure 21. At this point of the present application, each functional gate structure (22, 24, 26) has a topmost surface that is coplanar with a topmost surface of the hard mask cap 14. As is shown, a portion of each functional gate structure directly contacts the topmost surface of the silicon dioxide spacer 18P of the bottom spacer structure 21 and the topmost surface of the silicon nitride spacer portion 20P of the bottom spacer structure 21.

By "functional gate structure" it is meant a permanent gate structure used to control output current (i.e., flow of carriers in the channel) of a semiconducting device through electrical or magnetic fields. Each functional gate structure may include a gate dielectric liner 22, a gate conductor liner 24, and a gate conductor structure 26. In some embodiments, the gate conductor liner 24 may be omitted. The gate dielectric liner 22 and the gate conductor liner 24 may be U-shaped. By "U-shaped" it is meant a material that has a horizontal portion and two vertical portions extending upward from each end of the horizontal portion.

Each gate dielectric liner 22 is composed of a gate dielectric material such as, for example, a dielectric oxide, nitride, and/or oxynitride. In one example, the gate dielectric material that provides each gate dielectric liner 22 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric material of each gate dielectric liner 22. The gate dielectric material that provides each gate dielectric liner 22 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material that can provide each gate dielectric liner 22 can have a thickness in a range from 1 nm to 10 nm. Other thicknesses that are lesser than, or greater than, the aforementioned thickness range can also be employed for the gate dielectric material of each gate dielectric liner 22.

Each gate conductor liner 24, which is contact with an exposed surface of a respective gate dielectric liner 22, can include a gate conductor material. The gate conductor material used in providing each gate conductor liner 24 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

Each gate conductor liner 24 may be composed of nFET gate metal or a pFET gate metal. The gate conductor material used in providing each gate conductor liner 24 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, gate conductor liner 24 can have a thickness from 20 nm to 100 nm. Other thicknesses that are lesser than, or greater than, the aforementioned thickness range can also be employed for the gate conductor liner 24.

Each gate conductor structure 26 comprises one of the conductor materials mentioned above for the gate conductor liner 24. Typically, but not necessarily always, each gate conductor structure 26 comprises a different gate conductor material than the gate conductor liner 24. For example, each gate conductor liner 24 may include an nFET gate metal or a pFET gate metal and the gate conductor structure 26 may comprise polysilicon or an elemental metal such as tungsten. Each gate conductor structure 26 can be formed by first depositing a gate conductor material utilizing one of the deposition processes mentioned above in forming gate conductor liner 24.

After providing each material layer of the functional gate structure, a planarization process such as, for example, chemical mechanical polishing (CMP), may be employed to provide the planar structure shown in FIG. 7. During the planarization, the another silicon dioxide spacer 18P and the another silicon nitride spacer 20P that remain atop each hard mask cap 14 are removed from atop each hard mask cap 14.

Figure 8:
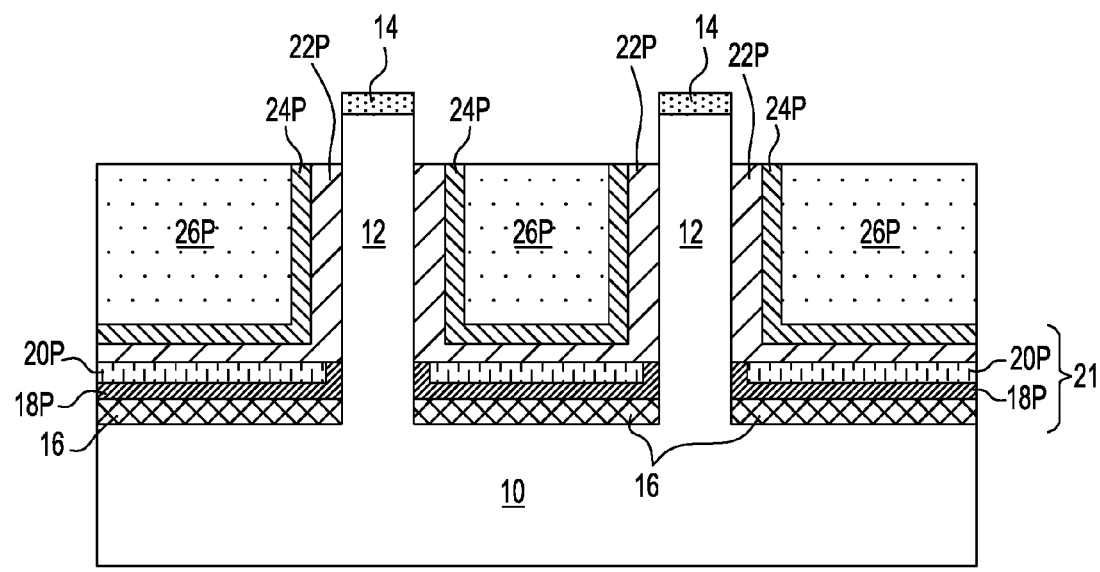
FIG. 8 is a cross sectional view of the exemplary semiconductor structure of FIG. 7 after recessing each functional gate structure.

Referring now to FIG. 8, there is illustrated the exemplary semiconductor structure of FIG. 7 after recessing each functional gate structure (22, 24, 26). The recessing, which removes an upper portion of each functional gate structure (22, 24, 26) may be performed utilizing a recess etch. The recess etch provides a functional gate structure that now includes a remaining portion of the gate dielectric liner 22, a remaining portion of the gate conductor liner 24 (if present), and a remaining portion of the gate conductor structure 26. The remaining portion of the gate dielectric liner 22 may be referred to herein as a gate dielectric liner portion 22P, the remaining portion of the gate conductor liner 24, if present, may be referred to herein as a gate conductor liner portion 24P, and the remaining portion of the gate conductor structure 26 may be referred to herein as a gate conductor portion 26P.

Figure 9:
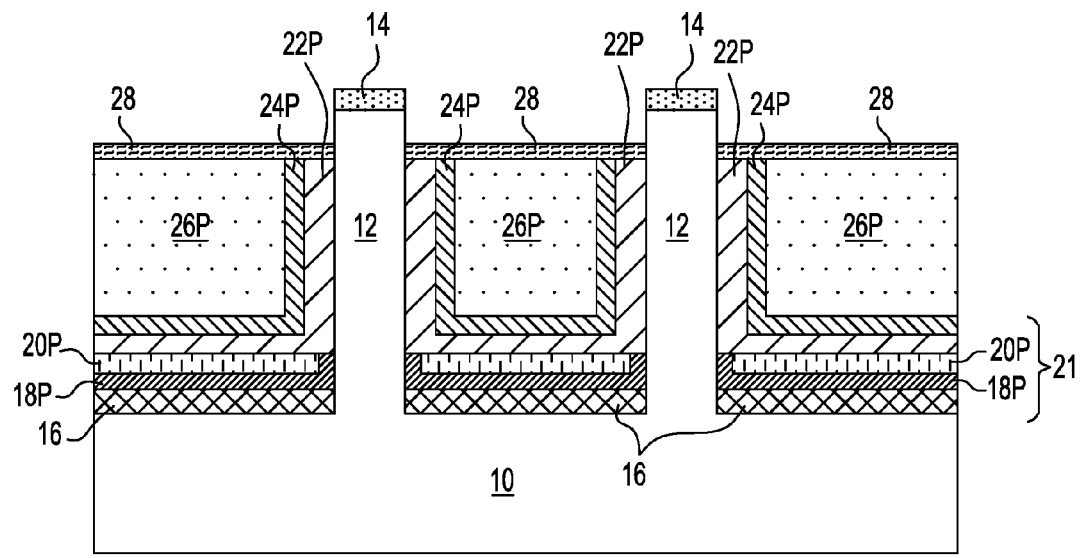
FIG. 9 is a cross sectional view of the exemplary semiconductor structure of FIG. 8 after forming a top spacer.

Referring now to FIG. 9, there is illustrated the exemplary semiconductor structure of FIG. 8 after forming a top spacer 28. Top spacer 28 may be formed by deposition of a spacer dielectric material. A recess etch may follow the deposition of the spacer dielectric material. The spacer dielectric material that provides the top spacer 28 may include for example, silicon dioxide, silicon nitride and/or silicon oxynitride. The top spacer 28 has a height that does not exceed the height of the semiconductor fin 12. Hence, the topmost surface of the top spacer 28 is located beneath a topmost surface of the semiconductor fin 12.

Figure 10:
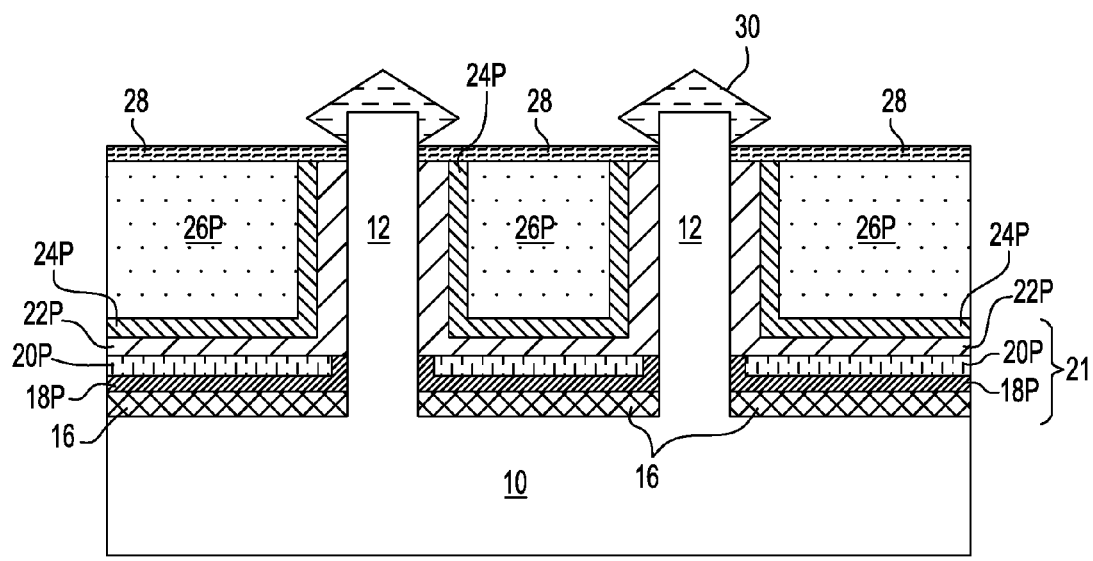
FIG. 10 is a cross sectional view of the exemplary semiconductor structure of FIG. 9 after forming a top source/drain structure from exposed surfaces of an upper portion of each semiconductor fin in accordance with one embodiment of the present application.

Referring now to FIG. 10, there is illustrated the exemplary semiconductor structure of FIG. 9 after forming top source/drain structures 30. Notably, FIG. 10 illustrates the exemplary semiconductor structure of FIG. 9 after forming a top source/drain structure 30 from exposed surfaces (top and sidewall) of an upper portion of each semiconductor fin 12 in accordance with one embodiment of the present application. In FIG. 10, each hard mask cap 14 is removed from atop each semiconductor fin 12 to expose a topmost surface of the semiconductor fin 12. Each hard mask cap 14 may be removed utilizing a planarization process.

The top source/drain structures 30 can be formed utilizing an epitaxial growth (or deposition) as defined above. Each top source/drain structure 30 includes a semiconductor material and a dopant (n-type or p-type) as defined above. The dopant, which is of the same conductivity type as the bottom source/drain region 16 can be added during the epitaxial growth of the semiconductor material that provides each top source/drain structure 30 or after epitaxially depositing an intrinsic semiconductor material utilizing a gas phase doping process. The dopant can be present in each top source/drain structure 30 in a range as mentioned above for the bottom source/drain region 16. The semiconductor material that provides the each top source/drain structure 30 may be the same as, or different from, the semiconductor material that provides the semiconductor fin 12.

In some embodiments, and as shown, each top source/drain structure 30 may have faceted surfaces, i.e., non-planar surfaces. Such an embodiment is depicted in FIG. 10. In some embodiments and as also shown in FIG. 10, each top source/drain structure 30 is triangular in shape, wherein the base of the triangle directly contacts one of the sidewalls of the upper portion of the semiconductor fin 12 and a tip of the triangle extends outward from the one sidewall of the upper portion of the semiconductor fin 12. In some embodiments, and as shown in FIG. 10, each triangle may merge above the topmost surface of the semiconductor fin 12. In such an instance, the top source/drain structure 30 has a diamond shape.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   forming at least one semiconductor fin extending upward from a surface of a substrate, wherein a bottom source/drain region is located at the footprint, and on each side, of the at least one semiconductor fin;
   forming a dielectric material stack of, from bottom to top, a silicon dioxide layer and a silicon nitride layer on exposed surfaces of each bottom source/drain region and the at least one semiconductor fin;
   carbonizing an upper surface of each horizontal portion of the silicon nitride layer;
   removing non-carbonized vertical portions of the silicon nitride layer;
   removing the carbonized portions of the silicon nitride layer; and
   removing vertical portions of the silicon dioxide layer from sidewalls of the at least one utilizing each remaining portion of the silicon nitride layer as an etch mask to provide a bottom spacer structure located on each bottom source/drain region, each bottom spacer structure comprises a remaining portion of the silicon dioxide layer and the remaining portion of the silicon nitride layer.

2. The method of claim 1, wherein the remaining portion of the silicon nitride layer is entirely separated from the at least one semiconductor fin by a first portion of the remaining portion of the silicon dioxide layer and entirely separated from the bottom source/drain region by a second portion of the remaining portion of the silicon dioxide layer.

3. The method of claim 1, wherein said carbonizing comprises a directional plasma carbon deposition process.

4. The method of claim 3, wherein the directional plasma carbon deposition process is performed utilizing an energy of 100 eV or less.

5. The method of claim 1, wherein the directional plasma carbon deposition process comprises generating a plasma from a carbon-containing ambient and performing the carbonizing at a temperature from 50° C. to 450° C.

6. The method of claim 1, wherein the removing the vertical portions of the silicon dioxide layer comprises a dry isotropic etching process.

7. The method of claim 1, further comprising:
   forming a functional gate structure located on each side of the at least one semiconductor fin and above the bottom spacer structure;
   forming a top spacer located on each functional gate structure and contacting a sidewall of a portion of the at least one semiconductor fin; and
   forming a top source/drain structure extending from each sidewall of an upper portion of the at least one semiconductor fin.

8. The method of claim 7, wherein the forming the top source/drain structure comprises an epitaxial growth process.

9. The method of claim 7, wherein each top source/drain structure has a faceted surface.

10. The method of claim 7, wherein each top source/drain structure has a non-faceted surface.

* * * * *